(12) United States Patent
Shinojima

(10) Patent No.: US 10,454,160 B2
(45) Date of Patent: Oct. 22, 2019

(54) ANTENNA DEVICE AND RADAR APPARATUS

(71) Applicant: DENSO TEN Limited, Kobe-shi, Hyogo (JP)

(72) Inventor: Takahiro Shinojima, Kawasaki (JP)

(73) Assignee: DENSO TEN Limited, Kobe-shi (JP)

( * ) Notice: Subject to any disclaimer, the term of this patent is extended or adjusted under 35 U.S.C. 154(b) by 0 days.

(21) Appl. No.: 15/906,572

(22) Filed: Feb. 27, 2018

(65) Prior Publication Data

US 2018/0337447 A1 Nov. 22, 2018

(30) Foreign Application Priority Data

May 19, 2017 (JP) ................. 2017-100058

(51) Int. Cl.
| | |
|---|---|
| *H01Q 1/36* | (2006.01) |
| *H01Q 1/38* | (2006.01) |
| *H05K 9/00* | (2006.01) |
| *H05K 1/02* | (2006.01) |
| *H01Q 17/00* | (2006.01) |
| *H01Q 1/24* | (2006.01) |
| *H01Q 1/52* | (2006.01) |
| *H01Q 1/08* | (2006.01) |
| *H01Q 15/00* | (2006.01) |
| *H01Q 3/01* | (2006.01) |
| *H01Q 21/06* | (2006.01) |

(52) U.S. Cl.
CPC .............. *H01Q 1/38* (2013.01); *H01Q 1/085* (2013.01); *H01Q 1/24* (2013.01); *H01Q 1/525* (2013.01); *H01Q 15/006* (2013.01); *H01Q 17/008* (2013.01); *H05K 1/028* (2013.01); *H05K 1/0237* (2013.01); *H05K 9/0083* (2013.01); *H05K 9/0088* (2013.01); *H01Q 3/01* (2013.01); *H01Q 21/065* (2013.01); *H05K 1/0236* (2013.01); *H05K 2201/10098* (2013.01)

(58) Field of Classification Search
CPC ........ H01Q 1/38; H01Q 15/006; H01Q 1/085; H01Q 17/008; H01Q 1/24; H01Q 1/525; H01Q 21/065; H01Q 3/01; H05K 9/0088; H05K 1/028; H05K 9/0083; H05K 1/0237; H05K 2201/10098; H05K 1/0236
USPC ...................................................... 343/700 R
See application file for complete search history.

(56) References Cited

U.S. PATENT DOCUMENTS

| | | | |
|---|---|---|---|
| 7,777,664 B2 * | 8/2010 | Masuda | H01Q 15/14 342/1 |
| 2012/0105300 A1 * | 5/2012 | Ando | G01S 7/032 343/872 |

FOREIGN PATENT DOCUMENTS

| | | |
|---|---|---|
| JP | H09-232822 A | 9/1997 |
| JP | 2002-158484 A | 5/2002 |
| JP | 2007-013531 A | 1/2007 |
| WO | 2011/114622 A1 | 9/2011 |

* cited by examiner

*Primary Examiner* — Jean B Jeanglaude
(74) *Attorney, Agent, or Firm* — Oliff PLC

(57) ABSTRACT

There is provided an antenna device configured to be shaped as a sheet. The antenna device includes an antenna portion provided on one surface of the sheet and configured to implement at least one of transmission of a transmission wave and reception of a reflected wave from a target, and an absorption unit provided on the other surface of the sheet and configured to absorb spurious.

6 Claims, 7 Drawing Sheets

ANTENNA DEVICE AND RADAR APPARATUS

CROSS-REFERENCE TO RELATED APPLICATIONS

This application is based on and claims priority under 35 USC 119 from Japanese Patent Application No. 2017-100058 filed on May 19, 2017.

TECHNICAL FIELD

The present disclosure relates to an antenna device and a radar apparatus.

BACKGROUND

In recent years, a technology relating to millimeter waves has been developed, and has been used in wide fields such as an in-vehicle radar, wireless communication, biological information sensing, and the like, for example. When the millimeter wave is used, since a high-gain antenna having high straightness and directionality can be designed and a wavelength is short, merits such as miniaturization of a device are obtained. However, an unintended signal component referred to as spurious (unwanted emission) is also emitted, so that it may influence signal characteristics of a radar apparatus. Patent Document 1 discloses an example of the related art relating to absorption of the spurious (unwanted emission).

A radio wave absorber of the related art disclosed in Patent Document 1 includes a magnetic layer including a magnetic material having a micro structure in which particle diameters are controlled to 1 to 100 nm. Thereby, the radio wave absorber has a thin shape having a thickness of 1 mm or less, and has also favorable absorption performance for an electromagnetic wave of high frequency.

Patent Document 1: JP-A-2002-158484

However, the related art disclosed in Patent Document 1 has a problem that it is necessary to provide a separate member such as the radio wave absorber when absorbing the spurious, although the member is thin. Accordingly, it is concerned that it is not possible to miniaturize a device configured to use the millimeter wave.

SUMMARY

It is therefore an object of the disclosure to provide a technology by which it is possible to transmit a desired transmission wave, to receive a reflected wave and to reduce spurious (unwanted emission) with a miniaturized configuration.

According to an aspect of the embodiments of the present invention, an antenna device configured to be shaped as a sheet, the antenna device including: an antenna portion provided on one surface of the sheet and configured to implement at least one of transmission of a transmission wave and reception of a reflected wave from a target, and an absorption unit provided on the other surface of the sheet and configured to absorb spurious.

The antenna device may be curved into a shape where a surface of the antenna portion is convex and a surface of the absorption unit is concave.

In the antenna device, the antenna portion and the absorption unit may have a meta material structure. Cells may be periodically arranged on the antenna portion and the absorption unit respectively, and the meta material structure may have a stacking structure comprising a first conductive layer, a dielectric layer, and a second conductive layer in corresponding order from the outermost layer.

In the antenna device, the first conductive layer and the second conductive layer of each cell may have, respectively, a ring-shaped peripheral edge part, an island-shaped part arranged at an inner side of the peripheral edge part, and a connection part configured to connect the peripheral edge part and the island-shaped part each other.

The antenna device may further include a shield unit provided between the antenna portion and the absorption unit so as to reduce interference of radio waves of the antenna portion and the absorption unit.

According to an aspect of the embodiments of the present invention, a radar apparatus may include: the antenna device; an electronic substrate, and an electronic component mounted on the electronic substrate. The antenna device is attached to a surface of the electronic substrate having the electronic component mounted thereon with one surface of the absorption unit facing the surface.

According to the configuration of the present disclosure, the antenna portion and the absorption unit are provided on the two surfaces of the antenna device having one sheet shape. Accordingly, it is possible to transmit a desired transmission wave, to receive a reflected wave and to reduce spurious (unwanted emission) with a miniaturized configuration.

BRIEF DESCRIPTION OF THE DRAWINGS

Exemplary embodiments of the present invention will be described in detail based on the following figures, wherein.

DETAILED DESCRIPTION

Hereinafter, exemplary illustrative embodiments of the present disclosure will be described in detail with reference to the drawings. In the meantime, the present disclosure is not limited thereto.

1. First Illustrative Embodiment

<1-1. Overall Configuration of Radar Apparatus>

Figure 1:
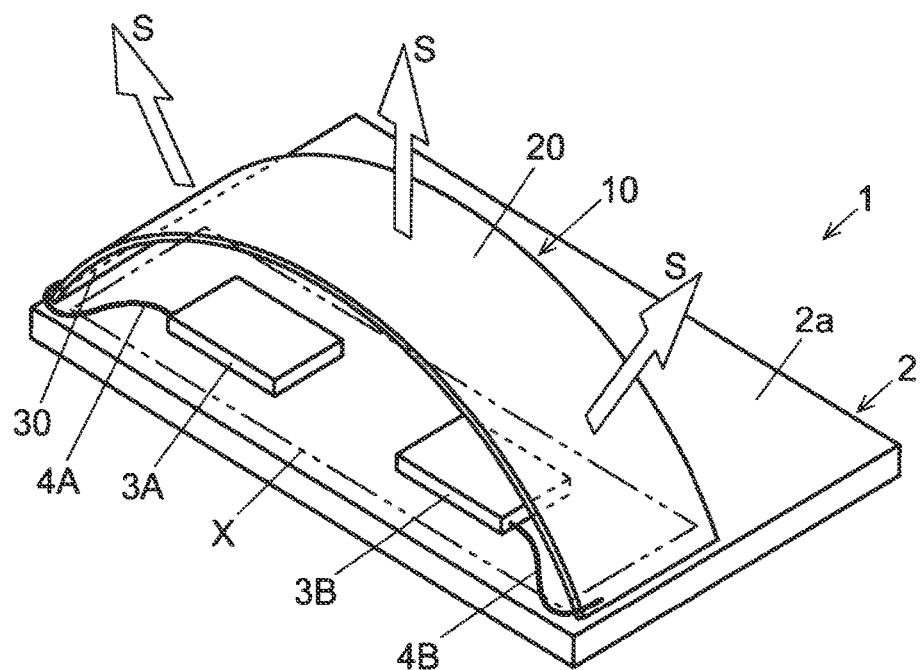
FIG. 1 is a perspective view depicting a radar apparatus of a first illustrative embodiment.
Figure 2:
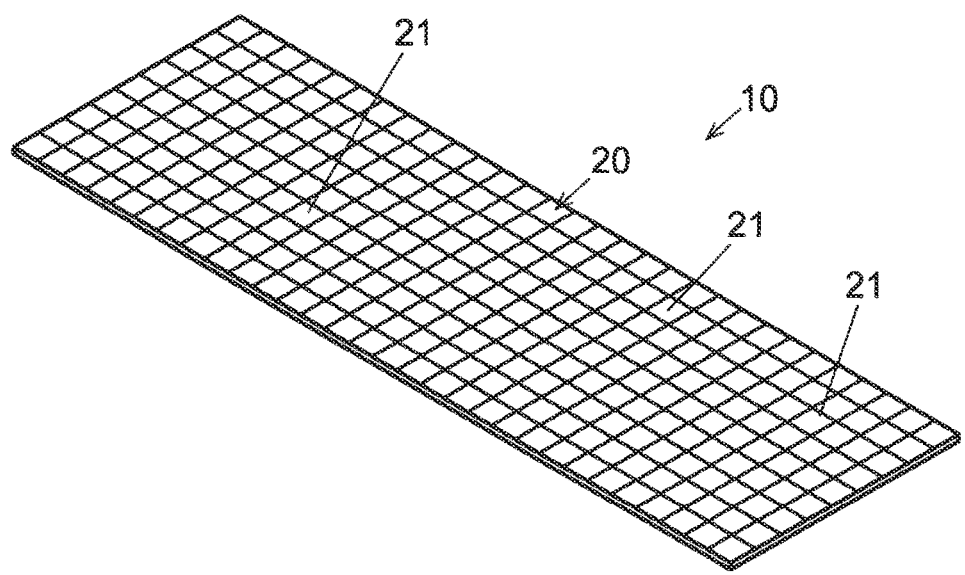
FIG. 2 is a perspective view depicting an antenna device of the first illustrative embodiment.

FIG. 1 is a perspective view depicting a radar apparatus 1 of a first illustrative embodiment. FIG. 2 is a perspective view depicting an antenna device 10. In the meantime, FIG. 2 depicts a state where the antenna device 10 (refer to FIG. 1), which is to be attached to the radar apparatus 1 with being curved (refer to FIG. 1), is stretched in a flat plate shape.

The radar apparatus 1 of the first illustrative embodiment is a radar apparatus that is to be mounted on a vehicle, for example, and is configured to scan the front of the apparatus. The radar apparatus 1 is provided on an outer package of a surface, a side surface or a rear surface of the vehicle, and is configured to transmit a transmission wave of a millimeter wave band toward the surrounding of the vehicle. Also, the radar apparatus 1 is configured to receive a reflected wave reflected on a target such as a leading vehicle, an opposite vehicle, a road side installation, and the like.

The radar apparatus 1 includes an electronic substrate 2, electronic components 3A, 3B and an antenna device 10 shown in FIG. 1.

The electronic substrate 2 is formed of a synthetic resin such as epoxy resin, and is formed to have a plate shape. A surface 2a of the electronic substrate 2 is mounted thereon with components (not shown) including the electronic components 3A, 3B. In the meantime, a back surface, which is opposite to the surface 2a of the electronic substrate 2, may also be mounted thereon with components.

The electronic components 3A, 3B are electronic components including a high-frequency integrated circuit configured to execute signal processing such as oscillation, amplification, modulation, frequency conversion and the like of a high frequency signal, and are for example MMICs (Monolithic Microwave Integrated Circuits). For example, the electronic component 3A is an MIMIC for transmission, and the electronic component 3B is an MIMIC for reception. The electronic component 3A for transmission and the electronic component 3B for reception may be provided in plural, respectively.

The electronic components 3A, 3B are mounted on the surface 2a of the electronic substrate 2. The electronic components 3A, 3B are electrically connected to an antenna portion 20 of the antenna device 10, which will be described later, via transmission lines 4A, 4B.

The antenna device 10 is provided on the surface 2a of the electronic substrate 2, on which the electronic components 3A, 3B are mounted. As shown in FIG. 2, the antenna device 10 has a rectangular sheet shape, as seen from above. As shown in FIG. 1, the antenna device 10 is curved into a circular arc shape at a central part thereof in a direction of separating from the surface 2a of the electronic substrate 2, and both end portions thereof are attached to the radar apparatus 1. The electronic components 3A, 3B are arranged at an inner side of a projection region X of the antenna device 10, as seen from the front of the surface 2a of the electronic substrate 2.

The antenna device 10 has an antenna portion 20 formed on a surface thereof. The antenna portion 20 is configured to transmit a transmission wave toward a direction denoted with an arrow S in FIG. 1. Also, the antenna portion 20 is configured to receive a reflected wave, which is formed as the transmission wave transmitted from the antenna portion 20 is reflected on a target. Like this, the antenna device 10 has the antenna portion 20 for transmission and reception.

In the first illustrative embodiment, the antenna device 10 may be configured as follows so that the antenna portion 20 functions as an antenna capable of transmitting and receiving a radio wave. For example, the antenna device 10 may be configured in such a way that the antenna portion 20 is configured as a transmission antenna and a receiving antenna configured to receive a transmission wave transmitted from the antenna portion 20 is arranged at an outer side of the projection region X of the surface 2a of the electronic substrate 2. Also, the antenna device 10 may be configured in such a way that the antenna portion 20 is configured as a receiving antenna and the transmission antenna is arranged at an outer side of the projection region X of the surface 2a of the electronic substrate 2.

<1.2 Detailed Configuration of Antenna Device>

Figure 3:
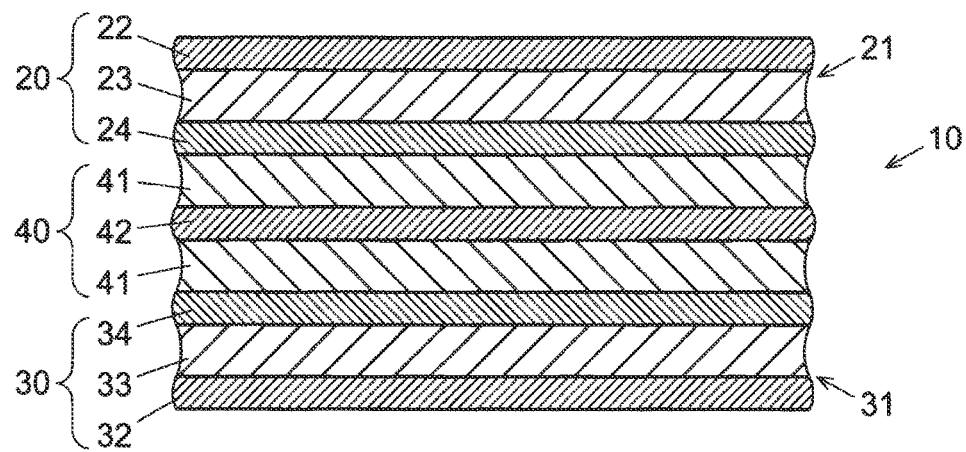
FIG. 3 is a partial sectional view of the antenna device of the first illustrative embodiment.
Figure 4:
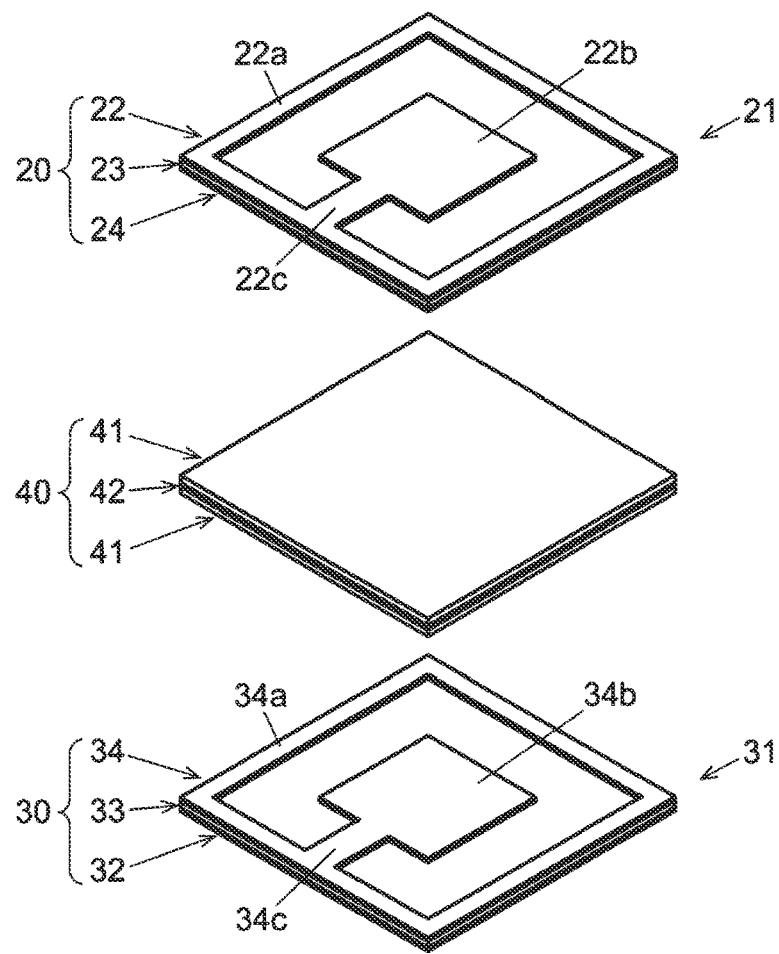
FIG. 4 is a partial exploded perspective view of the antenna device of the first illustrative embodiment.
Figure 5:
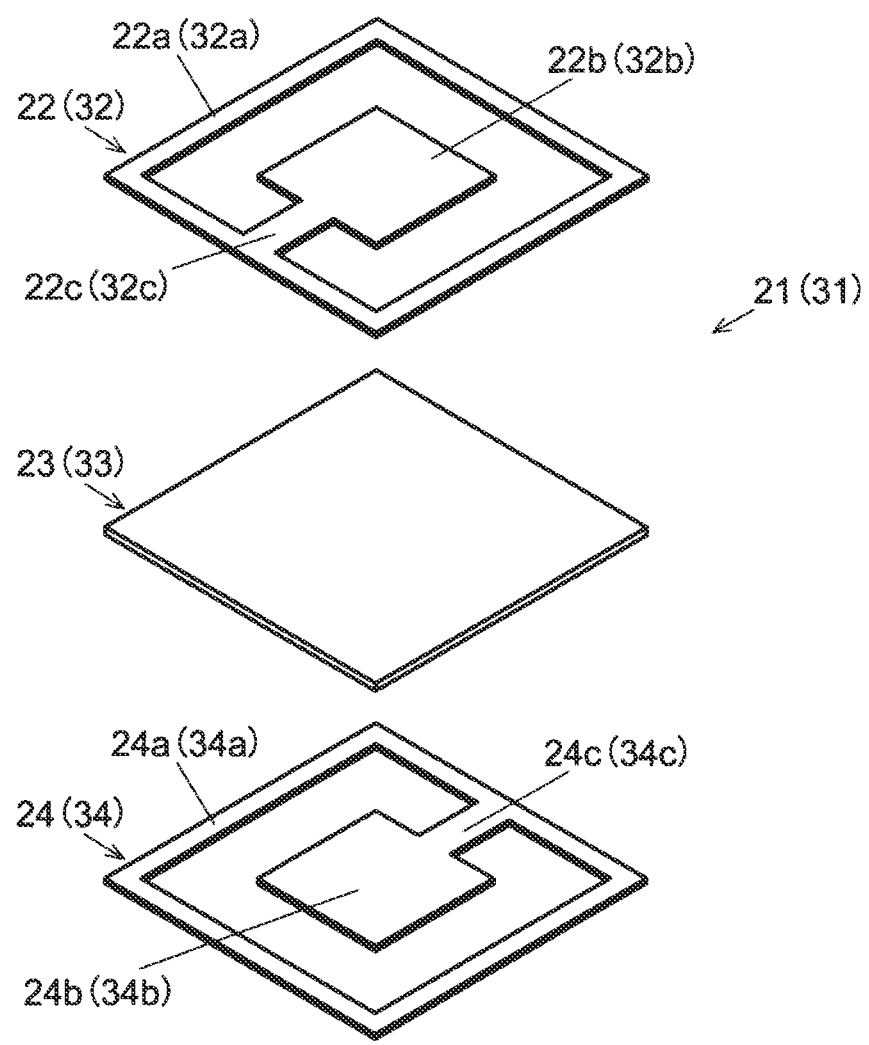
FIG. 5 is an exploded perspective view of a cell of the antenna device of the first illustrative embodiment.
Figure 6:
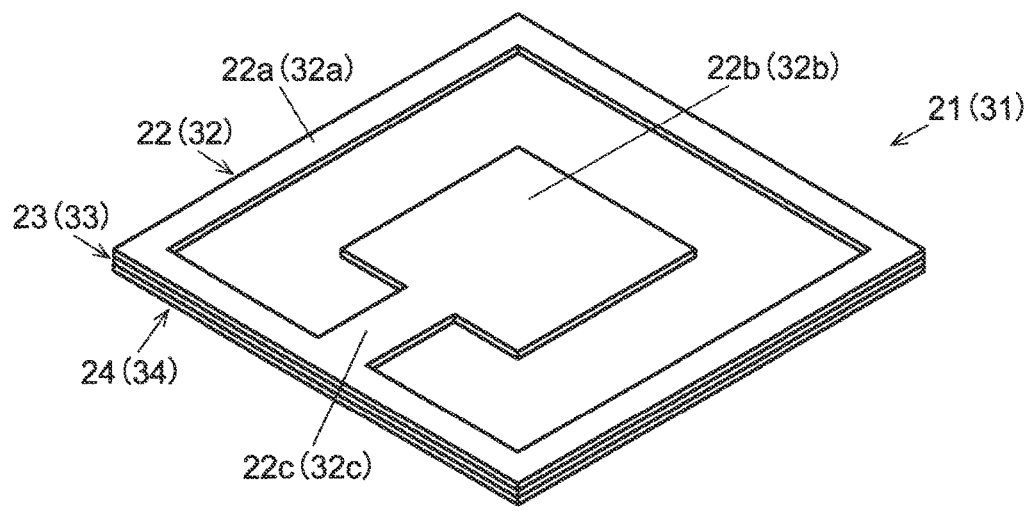
FIG. 6 is a perspective view of the cell of the antenna device of the first illustrative embodiment.
Figure 7:
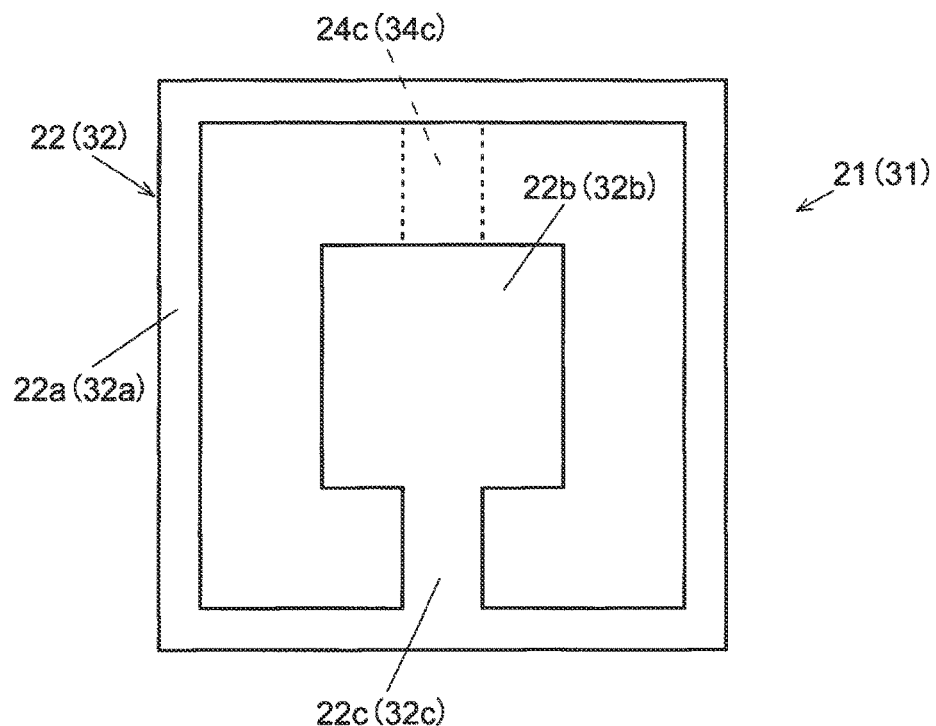
FIG. 7 is a front view of the cell of the antenna device of the first illustrative embodiment.

Subsequently, a detailed configuration of the antenna device 10 is described. FIG. 3 is a partial sectional view of the antenna device 10. FIG. 4 is a partial exploded perspective view of the antenna device 10. FIG. 5 is an exploded perspective view of a cell of the antenna device 10. FIG. 6 is a perspective view of the cell of the antenna device 10. FIG. 7 is a front view of the cell of the antenna device 10. In the meantime, as described later, since a cell 21 of the antenna portion 20 and a cell 31 of an absorption unit 30 have the same configuration, the constitutional elements of the cells 21, 31 are denoted with the same reference numerals in FIGS. 4 to 7.

As described above, the antenna device 10 has a rectangular sheet shape, as seen from above (refer to FIG. 2). The antenna device 10 includes the antenna portion 20, the absorption unit 30 and a shield unit 40, which are shown in FIGS. 3 and 4. The antenna portion 20 is provided on one surface of the antenna device 10, and the absorption unit 30 is provided on the other surface. The shield unit 40 is provided between the antenna portion 20 and the absorption unit 30.

As shown in FIG. 1, the antenna device 10 is curved into a shape where a surface of the antenna portion 20 is convex and a surface of the absorption unit 30 is concave. The antenna device 10 is curved with a constant radius of curvature.

As shown in FIG. 2, the antenna portion 20 has a meta material structure (EBG (Electromagnetic Band Gap) structure) in which a plurality of cells 21 is periodically arranged. In the meantime, the actual number of the cells 21 of the antenna portion 20 does not coincide with the numbers of the cells 21 shown in FIG. 2. As shown in FIGS. 4 to 7, the cell 21 has a square shape, for example, as seen from above. The cells 21 adjacent to each other are electrically connected at peripheral edge parts thereof without a gap. As shown in FIG. 3, the meta material structure of the antenna portion 20 has a stacking structure including a first conductive layer 22, a dielectric layer 23 and a second conductive layer 24 in corresponding order from the outermost layer.

The first conductive layer 22 is formed of metal such as a copper foil, for example. As shown in FIGS. 4 to 7, the first conductive layer 22 has a peripheral edge part 22a, an island-shaped part 22b and a connection part 22c.

The peripheral edge part 22a is provided at an edge part of an outer periphery of the cell 21, and has a rectangular ring shape, as seen from above. An outer periphery and an inner periphery of the peripheral edge part 22a have a square shape, respectively, as seen from above. Four sides of the outer periphery of the peripheral edge part 22a and four sides of the inner periphery of the peripheral edge part 22a are substantially parallel with each other, respectively. An interval between the side of the outer periphery of the peripheral edge part 22a and the side of the inner periphery, i.e., a width of the peripheral edge part 22a is substantially uniform over an entire circumference. In the meantime, the shapes of the outer periphery and the inner periphery of the peripheral edge part 22a are not limited to the square shape, and may be a rectangular shape, for example.

The island-shaped part 22b is spaced from the peripheral edge part 22a, and is provided at an inner side of the peripheral edge part 22a. An outer periphery of the island-shaped part 22b has a square shape, as seen from above. The four sides of the inner periphery of the peripheral edge part 22a and four sides of an outer periphery of the island-shaped part 22b are substantially parallel with each other, respectively. An interval between the side of the inner periphery of the peripheral edge part 22a and the side of the outer periphery of the island-shaped part 22b, i.e., a width of an intermediate part between the peripheral edge part 22a and the island-shaped part 22b is substantially uniform over an entire circumference. In the meantime, the shape of the outer periphery of the island-shaped part 22b is not limited to the square shape, and may be a circular shape or a rectangular shape, for example.

The connection part 22c is configured to connect the peripheral edge part 22a and the island-shaped part 22b and has a rectangular shape, as seen from above. A length of a short side of the connection part 22c, i.e., a width of the connection part 22c is shorter than one side of the inner periphery of the peripheral edge part 22a and one side of the outer periphery of the island-shaped part 22b. The connection part 22c is provided at substantially central parts in a longitudinal direction of one side of the inner periphery of the peripheral edge part 22a and one side of the outer periphery of the island-shaped part 22b, which face each other. In the meantime, the shape of the outer periphery of the connection part 22c is not limited to the rectangular shape, and may be a square shape, for example.

Here, an example of a size of the first conductive layer 22 is described. In the meantime, the size of the first conductive layer 22 is just exemplary, is not limited to the example and can be changed in correspondence to a desired frequency. This also applies to sizes of the dielectric layer 23 and the conductive layer 24, which will be described later.

The peripheral edge part 22a has such a size that a length of one side of the outer periphery is 1.0 mm and one side of the inner periphery is 0.8 mm. That is, a width of the peripheral edge part 22a is 0.1 mm. The island-shaped part 22b has such a size that one side of the outer periphery is 0.3 mm. A width of the connection part 22c (a length of a short side of the rectangular shape) is 0.2 mm. An interval between the side of the inner periphery of the peripheral edge part 22a and the side of the outer periphery of the island-shaped part 22b, i.e., a length of the connection part 22c (a length of a long side of the rectangular shape) is 0.25 mm. A thickness of the first conductive layer 22 is 0.01 mm.

The peripheral edge part 22a, the island-shaped part 22b and the connection part 22c are integrally formed on the substantially same plane and are electrically connected. The peripheral edge part 22a, the island-shaped part 22b and the connection part 22c are designed to have desired capacitance and inductance by a conductive part and a surrounding space part.

The surface of the antenna portion 20 is substantially the same direction as a direction in which the surface 2a of the electronic substrate 2 having the electronic components 3A, 3B mounted thereon faces, and faces outward. By the above configuration, the antenna portion 20 transmits a transmission wave, which is a millimeter wave of a desired frequency, for example 76 GHz, toward the direction denoted with the arrow S in FIG. 1, and receives a reflected wave from a target.

The dielectric layer 23 is formed of a material such as polyimide resin, glass epoxy resin or the like, for example. When the dielectric layer 23 is formed of polyimide resin, including the other dielectric layers to be described later, the antenna device 10 can be made flexible as a whole. Thereby, when assembling the antenna device 10, the antenna device 10 can be freely shaped. Also, when the dielectric layer 23 is formed of glass epoxy resin, including the other dielectric layers to be described later, the antenna device 10 can be made firm as a whole. Thereby, the antenna device 10 can be formed to have a shape determined from upon the assembling.

The dielectric layer 23 has a flat plate shape where an outer periphery is a square shape, as seen from above. When seeing the surface of the cell 21 from front, the dielectric layer 23 correctly overlaps with the first conductive layer 22. That is, a position of an outer periphery of the dielectric layer 23 and a position of an outer periphery of the first conductive layer 22 coincide with each other. An example of a size of the dielectric layer 23 is described. The dielectric layer 23 has such a size that one side of the outer periphery is 1.0 mm. A thickness of the dielectric layer 23 is 0.02 mm, for example.

The second conductive layer 24 is formed of metal such as a copper foil, for example. As shown in FIGS. 4 to 7, the second conductive layer 24 has a peripheral edge part 24a, an island-shaped part 24b and a connection part 24c.

The specific configurations of the peripheral edge part 24a, the island-shaped part 24b and the connection part 24c of the second conductive layer 24 are similar to the configurations of the peripheral edge part 22a, the island-shaped part 22b and the connection part 22c of the first conductive layer 22. Therefore, the detailed descriptions thereof are herein omitted. An example of a size of the second conductive layer 24 is the same as the example of the size of the first conductive layer 22 described above.

An outer periphery of the second conductive layer 24 has a square shape, as seen from above. When seeing a surface of the cell 21 from front, the second conductive layer 24 correctly overlaps with the dielectric layer 23 and the first conductive layer 22. That is, a position of the outer periphery of the second conductive layer 24, a position of the outer periphery of the dielectric layer 23, and a position of the outer periphery of the first conductive layer 22 coincide with each other.

In the meantime, as shown in FIGS. 5 and 7, the connection part 24c of the second conductive layer 24 is arranged at a position at which it does not overlap with the connection part 22c of the first conductive layer 22, when seeing the surface of the cell 21 from front. The connection part 24c of the second conductive layer 24 is arranged at a position corresponding to an opposite position of the connection part 22c with the island-shaped part 22b of the first conductive layer 22 being interposed therebetween.

The absorption unit 30 also has a meta material structure (EBG structure) in which a plurality of cells 31 (refer to FIGS. 3 and 4) is periodically arranged, like the antenna portion 20. The cell 31 has a square shape, for example, as seen from above. The cells 31 adjacent to each other are electrically connected. As shown in FIG. 3, the meta material structure of the absorption unit 30 has a stacking structure including a first conductive layer 32, a dielectric layer 33 and a second conductive layer 34 in corresponding order from the outermost layer.

As described above, the configuration of the cell 31 of the absorption unit 30 is the same as the configuration of the cell 21 of the antenna portion 20. Therefore, the detailed configurations of the first conductive layer 32, the dielectric layer 33 and the second conductive layer 34 of the absorption unit 30 are the same as the configurations of the first conductive layer 22, the dielectric layer 23 and the second conductive layer 24 of the antenna portion 20. An example of the sizes of the first conductive layer 32, the dielectric layer 33 and the second conductive layer 34 of the absorption unit 30 is also the same as the example of the sizes of the first conductive layer 22, the dielectric layer 23 and the second conductive layer 24 of the antenna portion 20 described above. Therefore, the detailed descriptions thereof are herein omitted. Like this, the antenna portion 20 and the absorption unit 30 having the similar configurations are provided at the front and back of one antenna device 10, so that it is possible to implement a plurality of functions of transmission of the transmission wave, reception of the reflected wave and absorption of spurious (unwanted emission) by one sheet.

More specifically, the surface of the absorption unit 30 faces inward with facing the surface 2a of the electronic substrate 2 having the electronic components 3A, 3B mounted thereon (refer to FIG. 1). By the configuration, the absorption unit 30 absorbs the unwanted spurious emitted from the electronic components 3A, 3B of a desired frequency band, for example, 20 to 60 GHz. The spurious absorbed by the absorption unit 30 may be dropped to the earth.

The shield unit 40 has a rectangular shape, which is similar to the entire antenna device 10, as seen from above. As shown in FIG. 3, the shield unit 40 has a stacking structure including two dielectric layers 41 and a conductive layer 42 sandwiched therebetween. The dielectric layer 41 is formed of polyimide resin, glass epoxy resin or the like, for example. The conductive layer 42 is formed of metal such as a copper foil, for example. The shield unit 40 is sandwiched between the antenna portion 20 and the absorption unit 30 and is configured to prevent interference of signals of the antenna portion 20 and the absorption unit 30.

As described above, the antenna device 10 has a sheet shape, and includes the antenna portion 20, which is provided on one surface of the sheet and is configured to implement at least one of transmission of the transmission wave and reception of the reflected wave from target, and the absorption unit 30, which is provided on the other surface of the sheet and is configured to absorb the spurious.

According to the above configuration, the antenna portion 20 and the absorption unit 30 are respectively provided on the two surfaces of the antenna device 10 having one sheet shape. Therefore, it is possible to transmit the desired transmission wave, to receive the reflected wave and to reduce the spurious (unwanted emission) with the miniaturized configuration.

The antenna portion 20 and the absorption unit 30 have the meta material structure in which the plurality of cells 21, 31 is periodically arranged, respectively. The meta material structures have the stacking structures including the first conductive layers 22, 32, the dielectric layers 23, 33, and the second conductive layers 24, 34 in corresponding order from the outermost layers, respectively.

According to the above configuration, it is possible to make the antenna portion 20 and the absorption unit 30 thin. That is, it is possible to transmit the desired transmission wave, to receive the reflected wave and to reduce the spurious (unwanted emission) by the thinned antenna device 10.

Also, the first conductive layers 22, 32 and the second conductive layers 24, 34 of the cells 21, 31 include the ring-shaped peripheral edge parts 22a, 32a, the island-shaped parts 22b, 32b arranged at the inner sides of the peripheral edge parts, and the connection parts 22c, 32c configured to connect the peripheral edge parts and the island-shaped parts, respectively. According to this configuration, it is possible to configure the antenna portion 20 for transmitting a transmission wave of a desired frequency. Also, it is possible to configure the absorption unit 30 for absorbing the spurious of a desired frequency band.

Also, the antenna portion 20 and the absorption unit 30 are provided therebetween with the shield unit 40 so as to reduce interference of radio waves of the antenna portion 20 and the absorption unit 30. According to this configuration, it is possible to implement the antenna portion 20 in which the interference is reduced and a favorable transmission characteristic is expressed. Also, it is possible to implement the absorption unit 30 in which the interference is reduced and a favorable absorption characteristic is expressed.

In the radar apparatus 1, the antenna device 10 is attached to the surface 2a of the electronic substrate 2 having the electronic components 3A, 3B mounted thereon with one surface of the absorption unit 30 facing the surface 2a. According to this configuration, it is possible to implement the radar apparatus 1 capable of transmitting the desired transmission wave, receiving the reflected wave and reducing the spurious (unwanted emission) with the miniaturized configuration.

<1-3. Curvature of Antenna Device>

Figure 8:
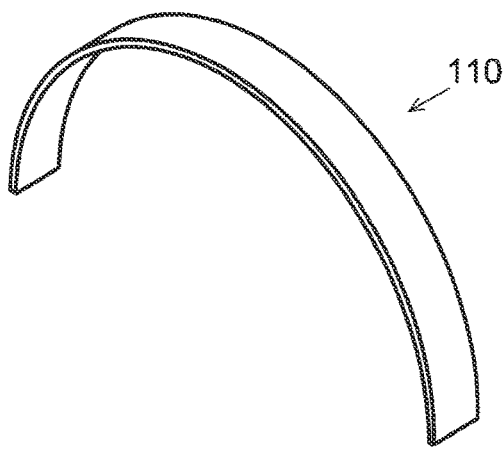
FIG. 8 is a perspective view depicting a first modified embodiment of the antenna device of the first illustrative embodiment.
Figure 9:
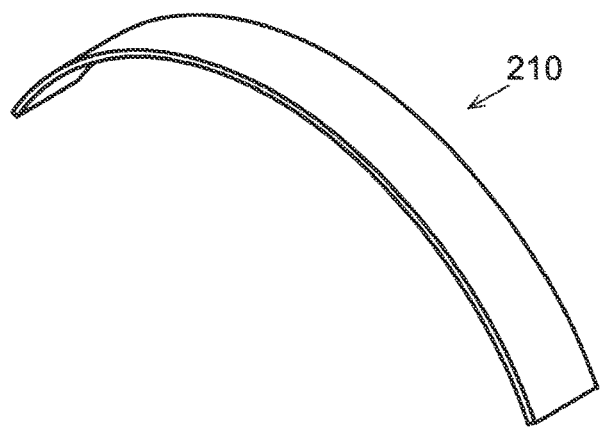
FIG. 9 is a perspective view depicting a second modified embodiment of the antenna device of the first illustrative embodiment.
Figure 10:
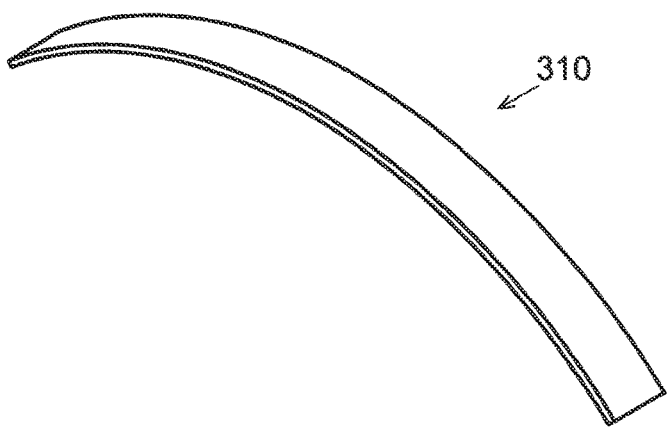
FIG. 10 is a perspective view depicting a third modified embodiment of the antenna device of the first illustrative embodiment.
Figure 11:
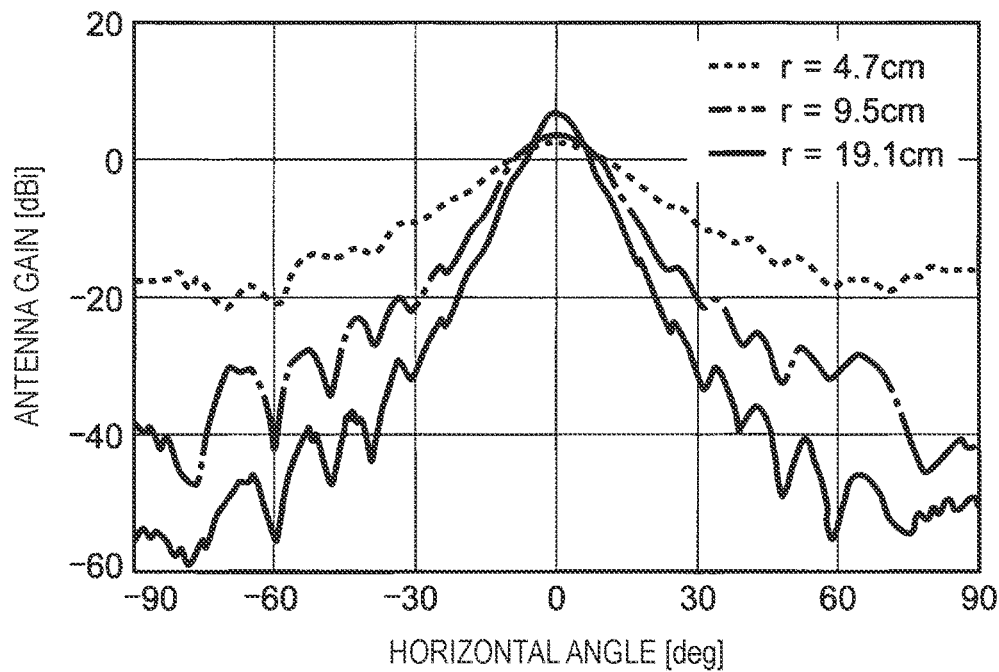
FIG. 11 is a graph depicting a transmission characteristic of the antenna device of the first illustrative embodiment.
Figure 12:
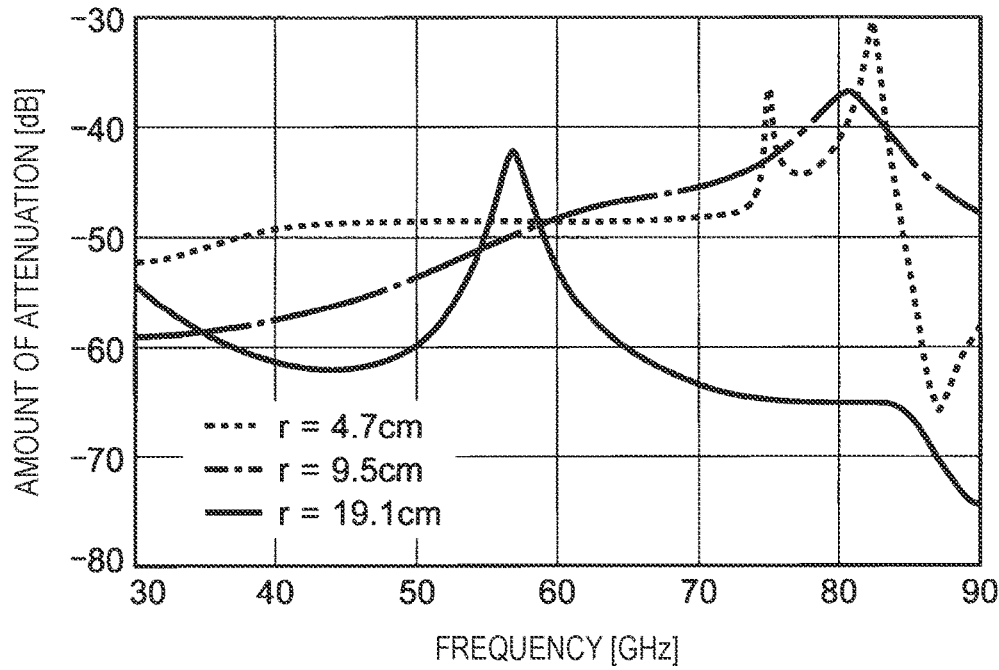
FIG. 12 is a graph depicting an absorption characteristic of the antenna device of the first illustrative embodiment.

Subsequently, a relation between a curvature of the antenna device 10 and the transmission characteristic and absorption characteristic is described. FIG. 8 is a perspective view depicting a first modified embodiment of the antenna device. FIG. 9 is a perspective view depicting a second modified embodiment of the antenna device. FIG. 10 is a perspective view depicting a third modified embodiment of the antenna device. FIG. 11 is a graph depicting a transmission characteristic of the antenna device. FIG. 12 is a graph depicting an absorption characteristic of the antenna device.

A radius of curvature r of an antenna device 110 of the first modified embodiment shown in FIG. 8 is 4.7 cm, for example. A radius of curvature r of an antenna device 210 of the second modified embodiment shown in FIG. 9 is 9.5 cm, for example. A radius of curvature r of an antenna device 310 of the third modified embodiment shown in FIG. 10 is 19.1 cm, for example. That is, the radius of curvature r of the antenna device increases in order of the antenna device 110 of the first modified embodiment, the antenna device 210 of the second modified embodiment and the antenna device 310 of the third modified embodiment. In the meantime, the three antenna devices have the same size in a state where they are stretched in a flat plate shape. For example, the long side is 15 cm and the short side is 3 cm.

FIG. 11 is a graph depicting a transmission characteristic of the transmission wave of the antenna portion 20 in each antenna device. In the graph shown in FIG. 11, a horizontal axis indicates a spread angle of the transmission wave when a radial direction of each antenna device is made horizontal, and a vertical axis indicates an antenna gain.

From FIG. 11, it can be seen that when the radius of curvature r of the antenna device increases, the antenna gain decreases, as compared to the gains of the other radii of curvature, as the spread angle becomes distant from a central part (0°) of the antenna device toward 90°. On the other hand, it can be seen that when the radius of curvature r of the antenna device is further decreased, the antenna gain increases, as compared to the gains of the other radii of curvature, as the spread angle becomes distant from the central part (0°) of the antenna device toward 90°.

Thereby, it can be seen that the transmission wave is transmitted over a wider range in the antenna device 110 of the first modified embodiment having the smaller radius of curvature r. That is, when the antenna device 110 of the first modified embodiment is used, it may be possible to exclude a necessity of a structure of scanning the radar apparatus or the antenna device in a horizontal direction. Accordingly, it can be said that the antenna device 110 of the first modified embodiment having the smaller radius of curvature r is most favorable with respect to the transmission characteristic of the transmission wave.

FIG. 12 is a graph depicting an absorption characteristic of the spurious (unwanted emission) of the absorption unit 30 in each antenna device. In the graph of FIG. 12, a horizontal axis indicates a frequency of the spurious, and a vertical axis indicates an amount of attenuation of the spurious.

From FIG. 12, it can be seen that as the radius of curvature r of the antenna device increases, a peak (resonance frequency) shifts toward the low frequency. Also, it can be seen that as the radius of curvature r of the antenna device increases, the amount of attenuation increases over the entire band.

Thereby, it can be seen that the antenna device 310 of the third modified embodiment having the greater radius of curvature r can more easily absorb the spurious (unwanted emission) over the entire band. Accordingly, it can be said that the antenna device 310 of the third modified embodiment having the greater radius of curvature r is most favorable with respect to the absorption characteristic of the spurious.

Considering the verification about the first to third modified embodiments, the antenna device 10 of the radar apparatus 1 shown in FIG. 1 is curved into the shape where the surface of the antenna portion 20 is convex and the surface of the absorption unit 30 is concave, and is provided on the surface 2a of the electronic substrate 2 on which the electronic components 3A, 3B are mounted.

According to the above configuration, it is possible to configure the antenna portion 20, which expresses the favorable transmission characteristic, and the absorption unit 30, which expresses the favorable absorption characteristic, on the two surfaces of the antenna device 10 having one sheet shape. When the shape design of the antenna device 10, i.e., the degree of curvature of the antenna device 10 is appropriately arbitrarily changed, it is possible to obtain the desired transmission characteristic and absorption characteristic.

In the meantime, when it is intended to preferentially achieve the angel-widening of the antenna portion 20, the radius of curvature r (for example r=4.7 cm) of the antenna device 110 of the first modified embodiment is set. Also, when it is intended to preferentially achieve the reduction of the spurious of the specific frequency band (for example, 38 GHz) by the absorption unit 30, the radius of curvature r (for example r=19.1 cm) of the antenna device 310 of the third modified embodiment is set. Also, when it is intended to secure both the angle-widening of the antenna portion 20 and the reduction of the spurious of the specific frequency band by the absorption unit 30, the radius of curvature r (for example r=9.5 cm) of the antenna device 210 of the second modified embodiment is set. In this way, considering the priority over the angle-widening of the target detection angle by the antenna portion 20 and the reduction of the spurious by the absorption unit 30, the optimal radius of curvature is set so as to balance the plurality of functions. Thereby, the radar apparatus 1 having the antenna device 10 can detect the correct information about a position and the like of the target.

2. Second Illustrative Embodiment

Figure 13:
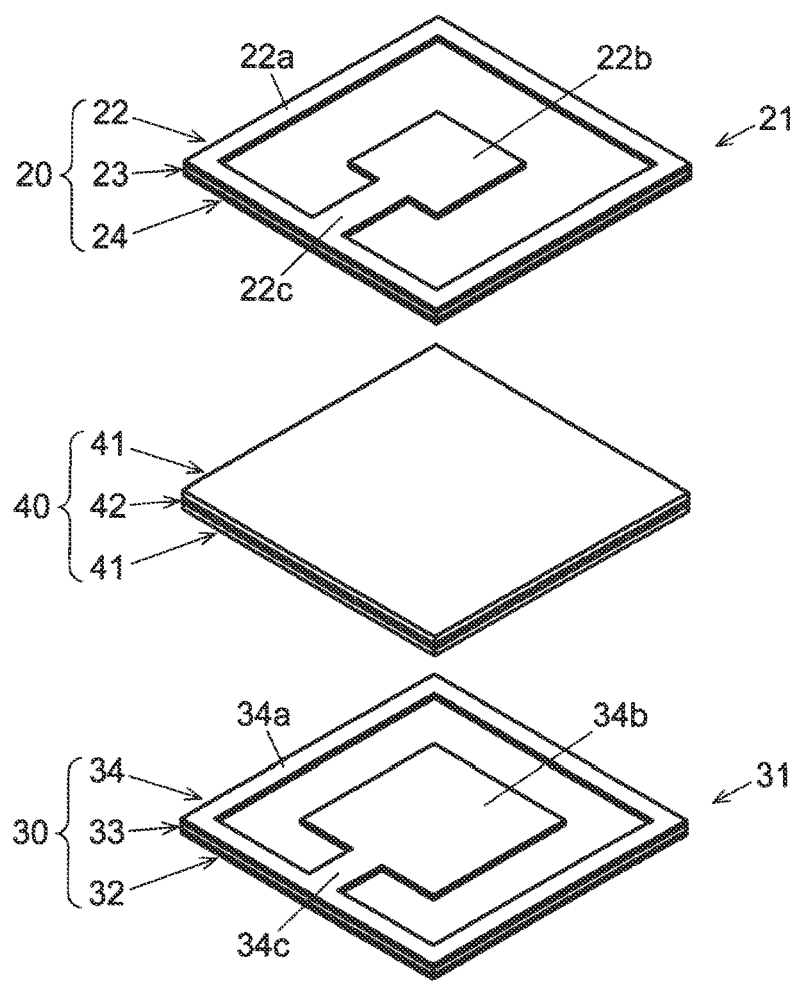
FIG. 13 is a partial exploded perspective view of an antenna device of a second illustrative embodiment.

Subsequently, a second illustrative embodiment is described. FIG. 13 is a partial exploded perspective view of the antenna device 10 of the second illustrative embodiment. In the meantime, since the basic configurations of the second illustrative embodiment are the same as the first illustrative embodiment, the constitutional elements different from the first illustrative embodiment are described in the below, and the descriptions of the constitutional elements common to the first illustrative embodiment are omitted.

The antenna device 10 of the second illustrative embodiment includes the antenna portion 20 and the absorption unit 30 shown in FIG. 13.

Here, the meta material structures (EBG structures) of the antenna portion 20 and the absorption unit 30 can arbitrarily change the frequency of the transmission wave, which is to be transmitted by the antenna portion 20, and the frequency band of the spurious, which is to be absorbed by the absorption unit 30, by changing the specifications of the cells 21, 31. Since the antenna portion 20 transmits the millimeter wave of 76 GHz, for example, the antenna portion 20 preferably has a specification that is effective at the high frequency band-side. On the other hand, since the absorption unit 30 intends to absorb the spurious of 20 to 60 GHz, for example, the absorption unit 30 preferably has a specification that is effective at the low frequency band-side.

For this reason, in the antenna portion 20 of the second illustrative embodiment, the outer shapes of the island-shaped parts 22b, 24b of the first conductive layer 22 and the second conductive layer 24 are made to be relatively small. On the other hand, in the absorption unit 30 of the second illustrative embodiment, the outer shapes of the island-shaped parts 32b, 34b of the first conductive layer 32 and the second conductive layer 34 are made to be relatively large.

Like this, values of capacitance and inductance of the conductive layer are changed in correspondence to the area of the island-shaped part. In correspondence to the change, the resonance frequency of the conductive layer is changed. Like the specific example of FIG. 13, the area of the island-shaped part 22b of the cell 21 of the antenna portion 20 is made smaller than the area of the island-shaped part 34b of the cell 31 of the absorption unit 30, so that the resonance frequency becomes greater than a predetermined value, and it is possible to secure a desired level when transmitting the transmission wave of 76 GHz, for example, from the antenna portion 20. Also, the area of the island-shaped part 34b of the cell 31 of the absorption unit 30 is made greater than the area of the island-shaped part 22b of the cell 21 of the antenna portion 20, so that the resonance frequency becomes smaller than the predetermined value, and the spurious of 30 to 50 GHz including 30 GHz, for example, is absorbed by the absorption unit 30. That is, it is possible to obtain the desired frequency characteristic by appropriately arbitrarily changing the design of the EBG structures of the antenna portion 20 and the absorption unit 30.

3. Third Illustrative Embodiment

Figure 14:
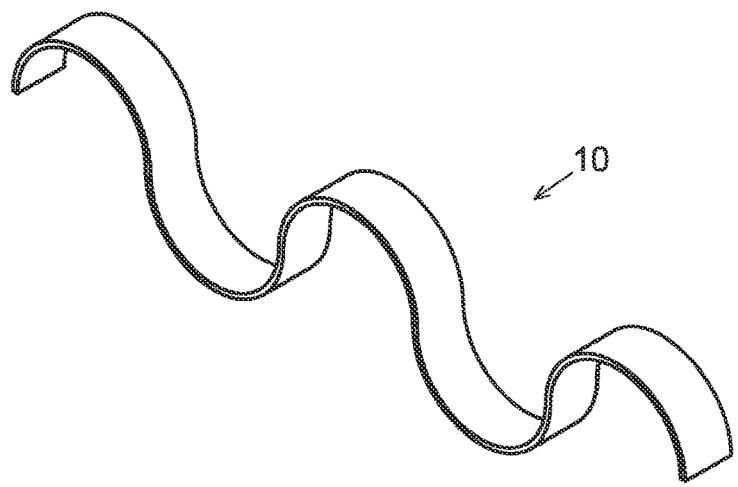
FIG. 14 is a perspective view of an antenna device of a third illustrative embodiment.

Subsequently, a third illustrative embodiment is described. FIG. 14 is a perspective view depicting the antenna device 10 of the third illustrative embodiment. In the meantime, since the basic configurations of the third illustrative embodiment are the same as the first illustrative embodiment, the constitutional elements different from the first illustrative embodiment are described in the below, and the descriptions of the constitutional elements common to the first illustrative embodiment are omitted.

As shown in FIG. 14, the antenna device 10 of the third illustrative embodiment has a wave shape, as a whole. In this way, the overall antenna device 10 is designed to have any shape, so that it is possible to make the antenna device 10 by a desired configuration with respect to the attachment of the antenna device 10 to the electronic substrate 2 and the transmission characteristic and absorption characteristic of the antenna device 10. That is, it is possible to balance the functions and mounting of the antenna device 10.

4. Others

Although the illustrative embodiments of the present disclosure have been described, the present disclosure is not limited to the illustrative embodiments and can be diversely modified.

For example, the sizes (numerical values) relating to the specifications of the antenna device 10 and the radar apparatus 1 described in the illustrative embodiments are just exemplary, and the present disclosure is not limited thereto. Also, the radio waves (the transmission wave and the reflected wave) that are used in the radar apparatus 1 are exemplary and "optical wave" and "ultrasonic wave" can also be used.

Also, in the above illustrative embodiments, the antenna device 10 is curved to have a constant radius of curvature or to have a wave shape. However, the other shapes are also possible. For example, the antenna device 10 may be stretched into a flat plate shape.

Also, when the electronic components 3A, 3B emit the spurious (unwanted emission) in a direction intersecting with a normal direction to the surface 2a of the electronic substrate 2, for example, the size of the antenna device 10 (the absorption unit 30) is preferably changed to an appropriate size. In this case, the antenna device 10 (the absorption unit 30) may be configured to have a dome shape, for example.

Also, in the above illustrative embodiments, the overall antenna device 10 is made flexible, as a whole. However, for example, the overall antenna device 10 may be made to have a firm shape having a predetermined radius of curvature in advance.

What is claimed is:

1. An antenna device shaped as a sheet, the antenna device comprising:
    an antenna portion provided on one surface of the sheet to implement at least one of transmission of a transmission wave and reception of a reflected wave from a target, and
    an absorption unit provided on the other surface of the sheet to absorb spurious.

2. The antenna device according to claim 1, wherein the antenna device is curved into a shape where a surface of the antenna portion is convex and a surface of the absorption unit is concave.

3. The antenna device according to claim 1,
    wherein the antenna portion and the absorption unit have a meta material structure,
    wherein a plurality of cells is periodically arranged on the antenna portion and the absorption unit respectively, and
    wherein the meta material structure has a stacking structure comprising a first conductive layer, a dielectric layer, and a second conductive layer in corresponding order from the outermost layer.

4. The antenna device according to claim 3, wherein the first conductive layer and the second conductive layer of each cell have, respectively,
    a ring-shaped peripheral edge part,
    an island-shaped part arranged at an inner side of the peripheral edge part, and
    a connection part connecting the peripheral edge part and the island-shaped part with each other.

5. The antenna device according to claim 3, further comprising a shield unit provided between the antenna portion and the absorption unit so as to reduce interference of radio waves of the antenna portion and the absorption unit.

6. A radar apparatus comprising:
    the antenna device according to claim 1;
    an electronic substrate, and
    an electronic component mounted on the electronic substrate,
    wherein the antenna device is attached to a surface of the electronic substrate having the electronic component mounted thereon with one surface of the absorption unit facing the surface.

* * * * *